(12) United States Patent
Kawai et al.

(10) Patent No.: US 11,196,403 B2
(45) Date of Patent: Dec. 7, 2021

(54) PIEZOELECTRIC VIBRATOR AND PIEZOELECTRIC VIBRATION DEVICE (71) Applicant: Murata Manufacturing Co., Ltd., Nagaokakyo (JP)

(72) Inventors: Ryota Kawai, Nagaokakyo (JP); Daisuke Nakamura, Nagaokakyo (JP); Toshio Nishimura, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 981 days.

(21) Appl. No.: 15/472,576

(22) Filed: Mar. 29, 2017

(65) Prior Publication Data

US 2017/0201226 A1  Jul. 13, 2017

Related U.S. Application Data

(63) Continuation of application No. PCT/JP2015/085408, filed on Dec. 17, 2015.

(30) Foreign Application Priority Data

Dec. 17, 2014 (JP) .............................. JP2014-255042

(51) Int. Cl.
*H03H 9/02* (2006.01)
*H03H 9/10* (2006.01)
*H03H 9/24* (2006.01)
*H03H 9/17* (2006.01)
*H03H 9/15* (2006.01)

(52) U.S. Cl.
CPC .... *H03H 9/02448* (2013.01); *H03H 9/02259* (2013.01); *H03H 9/10* (2013.01); *H03H 9/1057* (2013.01); *H03H 9/173* (2013.01); *H03H 9/2405* (2013.01); *H03H 2009/155* (2013.01); *H03H 2009/241* (2013.01)

(58) Field of Classification Search
CPC .... H03H 9/02448; H03H 9/10; H03H 9/1057; H03H 9/2405
See application file for complete search history.

(56) References Cited

U.S. PATENT DOCUMENTS 9,553,561 B2  1/2017  Umeda et al.
9,559,660 B2  1/2017  Pensala et al.
9,584,093 B2  2/2017  Nishimura et al.
(Continued)

FOREIGN PATENT DOCUMENTS

CN  103697875 A  4/2014
JP  H11-135586 A  5/1999
(Continued)

OTHER PUBLICATIONS

International Search Report issued in International Application No. PCT/JP2015/085408, dated Feb. 23, 2016.
(Continued)

*Primary Examiner* — Bryan P Gordon
(74) *Attorney, Agent, or Firm* — Arent Fox LLP (57) ABSTRACT

A piezoelectric vibrator is a piezoelectric vibrator including a vibration portion. The vibration portion has an n-type Si layer which is a degenerated semiconductor and which has a resistivity of not less than 0.5 mΩcm and not greater than 1.2 mΩcm and preferably not greater than 0.9 mΩcm.

14 Claims, 9 Drawing Sheets

(56) References Cited

U.S. PATENT DOCUMENTS

| | | | | |
|---|---|---|---|---|
| 2012/0286903 A1* | 11/2012 | Prunnila | ............ | H03H 9/02448 333/234 |
| 2013/0193807 A1* | 8/2013 | Mizusawa | ............... | H03H 9/171 310/351 |
| 2014/0001605 A1* | 1/2014 | Kawashima | ........ | H01L 21/3221 257/629 |
| 2014/0077898 A1* | 3/2014 | Pensala | ................ | H03H 3/0076 333/187 |
| 2015/0180449 A1* | 6/2015 | Umeda | .............. | H03H 9/02448 310/370 |
| 2016/0064642 A1 | 3/2016 | Nishimura et al. | | |
| 2016/0072473 A1 | 3/2016 | Nishimura et al. | | |

FOREIGN PATENT DOCUMENTS

| | | | | |
|---|---|---|---|---|
| JP | 2009-89231 A | 4/2009 | | |
| JP | 2013-157831 A | 8/2013 | | |
| JP | 2014-507096 A | 3/2014 | | |
| WO | WO-2012110708 A1 * | 8/2012 | ........... | H03H 3/0076 |
| WO | WO 2014/042020 A2 | 3/2014 | | |
| WO | WO 2014/185280 A1 | 11/2014 | | |
| WO | WO 2014/185282 A1 | 11/2014 | | |

OTHER PUBLICATIONS

Jaakkola et al., "Experimental Determination of the Temperature Dependency of the Elastic Constants of Degenerately Doped Silicon," Joint, IEEE, 2013, pp. 421-424.

Wanling et al., "Thin-Film Piezoelectric-On-Substrate Resonators with Q Enhancement and TCF Reduction," IEEE 23rd International Conference on Micro Electro Mechanical Systems (MEMS), 2010, pp. 727-730.

Written Opinion of the International Searching Authority issued in International Application No. PCT/JP2015/085408, dated Feb. 23, 2016.

* cited by examiner

PIEZOELECTRIC VIBRATOR AND PIEZOELECTRIC VIBRATION DEVICE

CROSS REFERENCE TO RELATED APPLICATIONS

The present application is a continuation of International application No. PCT/JP2015/085408, filed on Dec. 17, 2015, which claims priority to Japanese Patent Application No. 2014-255042, filed on Dec. 17, 2014, the entire contents of each of which are incorporated herein by reference.

TECHNICAL FIELD

The present invention relates to a piezoelectric vibrator and a piezoelectric vibration device.

BACKGROUND ART

Hitherto, a piezoelectric vibrator using an MEMS (Micro Electro Mechanical Systems) technique has been used as, for example, a timing device. Japanese Unexamined Patent Application Publication (Translation of PCT Application) No. 2014-507096 discloses an MEMS resonator having a vibration portion formed on a Si (silicon) layer. In the resonator, the resonant frequency changes with change of the ambient temperature due to the temperature dependence of Si. The temperature dependence is identified by a temperature coefficient of resonant frequency (TCF: Temperature Coefficient of Frequency).

In this vibrator, a Si layer is subjected to n-type or p-type doping in a predetermined doping amount in order to reduce the temperature coefficient of resonant frequency. However, the primary temperature coefficient of resonant frequency changes, for example, depending on the thickness of the Si layer, and thus, for example, even in a doping amount considered desirable in this document, a desired temperature coefficient of resonant frequency is not always able to be ensured. In addition, when the doping amount deviates from the desired doping amount, the temperature coefficient of resonant frequency sometimes increases. The fluctuations of the temperature coefficient of resonant frequency are not desirable for ensuring favorable temperature characteristics.

The present invention has been made in view of such a circumstance, and it is an object of the present invention to provide a piezoelectric vibrator and a piezoelectric vibration device which are able to reduce fluctuations of a temperature coefficient of resonant frequency.

BRIEF DESCRIPTION OF THE INVENTION

A piezoelectric vibrator according to an aspect of the present invention is a piezoelectric vibrator including a vibration portion having an n-type Si layer which is a degenerated semiconductor and which has a resistivity of not less than 0.5 mΩcm and not greater than 0.9 mΩcm.

According to the present invention, it is possible to provide a piezoelectric vibrator and a piezoelectric vibration device which are able to reduce fluctuations of a temperature coefficient of resonant frequency.

DESCRIPTION OF PREFERRED EMBODIMENTS

Figure 1:
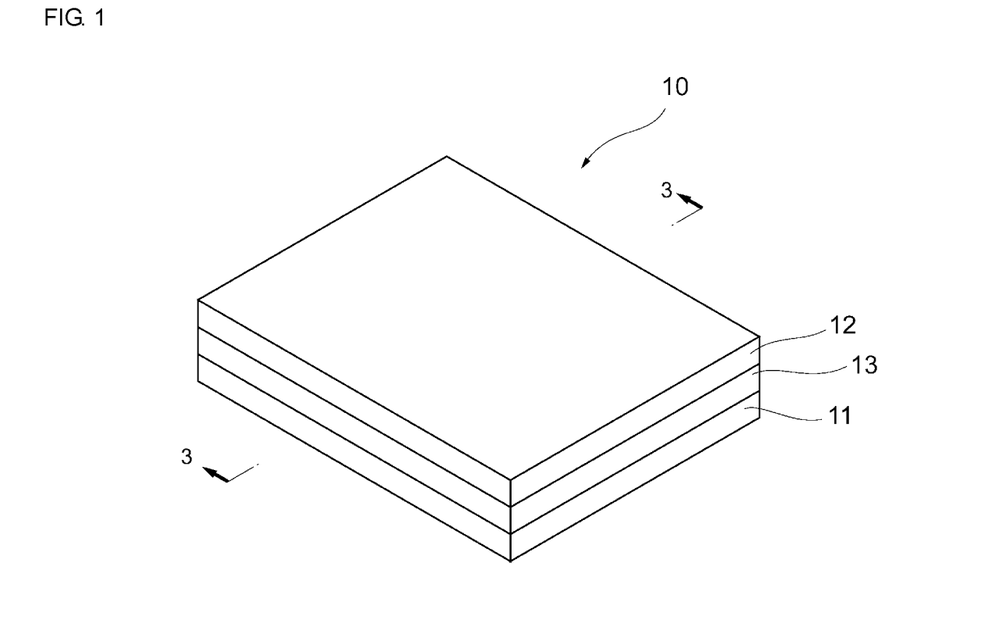
FIG. 1 is a perspective view schematically showing the appearance of a piezoelectric vibration device according to a first embodiment of the present invention.

Hereinafter, a first embodiment of the present invention will be described with reference to the accompanying drawings. FIG. 1 is a perspective view schematically showing the appearance of a piezoelectric vibration device 10 according to the first embodiment of the present invention. The piezoelectric vibration device 10 has, for example, a flattened rectangular parallelepiped shape and includes a lower substrate 11, an upper substrate 12 which forms a vibration space between the lower substrate 11 and the upper substrate 12, and a piezoelectric vibrator 13 which is interposed and held between the lower substrate 11 and the upper substrate 12. The piezoelectric vibrator 13 is an MEMS vibrator which is produced by using an MEMS technique.

Figure 2:
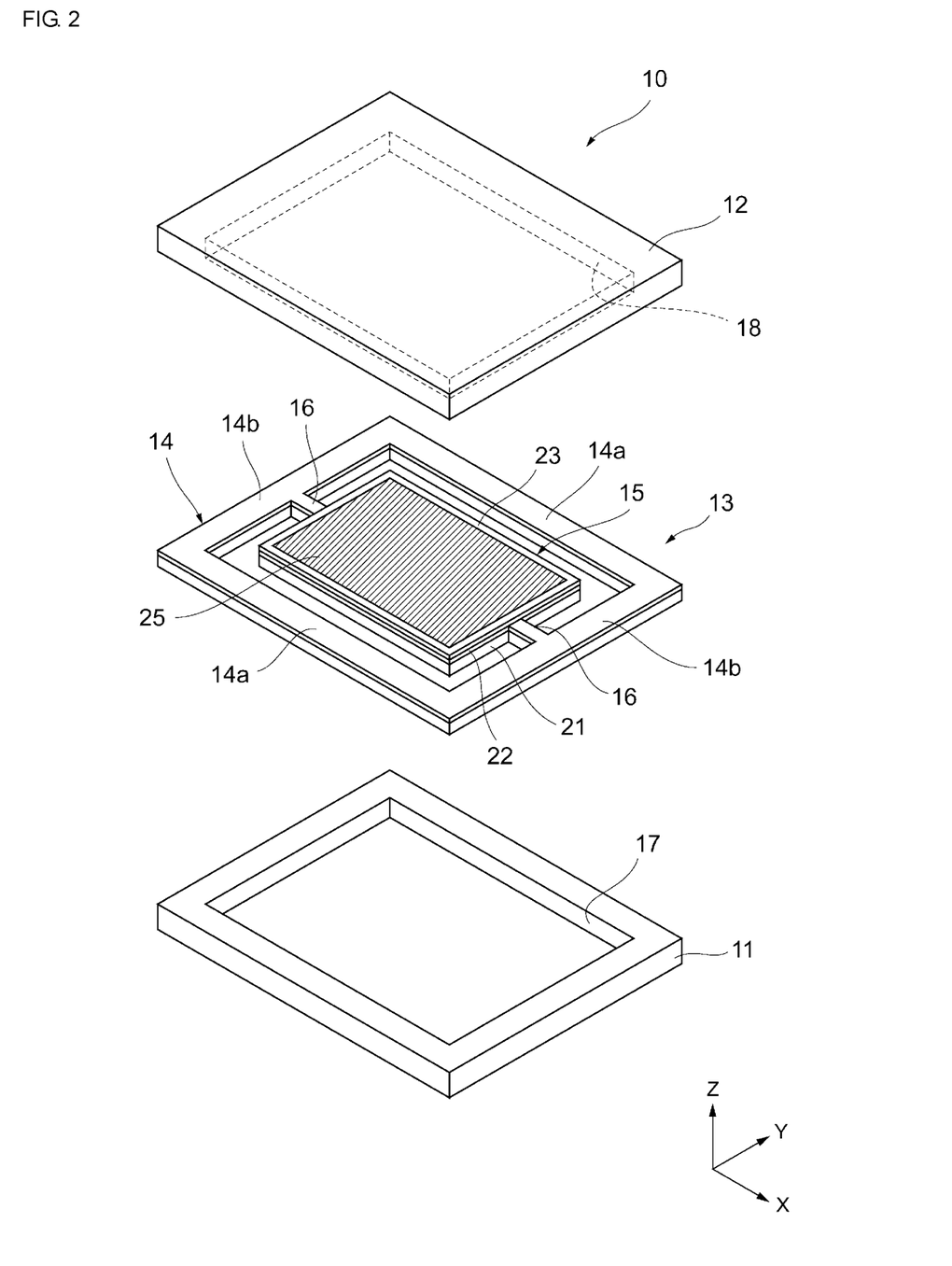
FIG. 2 is an exploded perspective view schematically showing the structure of the piezoelectric vibration device according to the first embodiment of the present invention.

FIG. 2 is an exploded perspective view schematically showing the structure of the piezoelectric vibration device 10 according to the first embodiment of the present invention. The piezoelectric vibrator 13 includes a support frame 14 which spreads in a rectangular flame shape along an XY plane in an orthogonal coordinate system in FIG. 2, a vibration portion 15 which is disposed inside the support frame 14 and spreads in a rectangular shape along the XY plane similarly to the support frame 14, and a pair of connection portions 16 which connect the support frame 14 and the vibration portion 15 to each other. As described later, the vibration portion 15 vibrates by repeating expanding and contracting along the XY plane in a Y-axis direction.

The support frame 14 includes a pair of long-side frame bodies 14a which extend parallel to an X axis and a pair of short-side frame bodies 14b which extend parallel to a Y axis and are connected at opposite ends thereof to respective opposite ends of the frame bodies 14a. In the present embodiment, the connection portions 16 extends on a straight line parallel to the X axis and connect the frame bodies 14b and the vibration portion 15 to each other. The positions of the connection portions 16 are set at the mid position of the vibration portion 15 in the Y-axis direction, that is, at end portions (node points) at the center position in the vibration direction of the vibration portion 15.

The lower substrate 11 spreads in a flat plate shape along the XY plane and has a recess 17 formed on the upper surface thereof. The recess 17 is formed, for example, in a flattened rectangular parallelepiped shape and forms a part of a vibration space for the vibration portion 15. Meanwhile, the upper substrate 12 spreads in a flat plate shape along the XY plane and has a recess 18 formed on the lower surface thereof. Similarly to the recess 17, the recess 18 is formed, for example, in a flattened rectangular parallelepiped shape and forms a part of the vibration space for the vibration portion 15.

Figure 3:
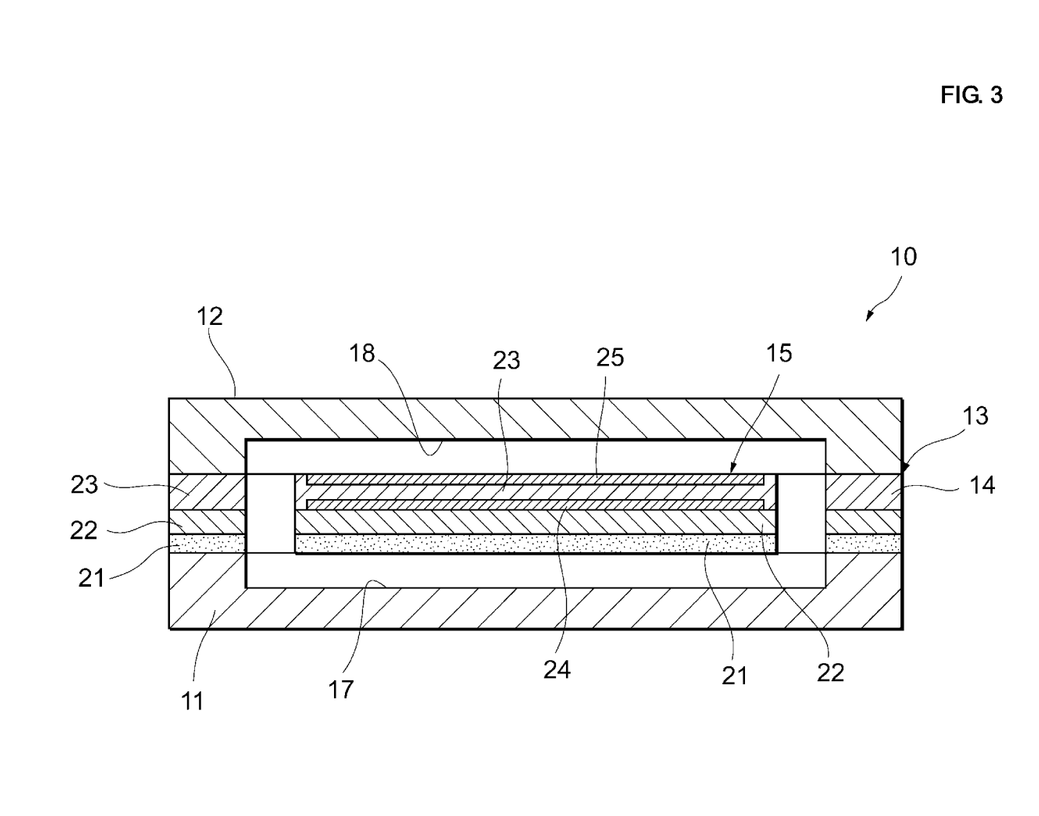
FIG. 3 is a schematic cross-sectional view taken along the line 3-3 in FIG. 1.

FIG. 3 is a schematic cross-sectional view taken along the line 3-3 in FIG. 1. The support frame 14 of the piezoelectric vibrator 13 is received on the periphery of the upper surface of the lower substrate 11, and the periphery of the lower surface of the upper substrate 12 is received on the upper surface of the support frame 14. In this manner, the piezoelectric vibrator 13 is held between the lower substrate 11 and the upper substrate 12 and the vibration space for the vibration portion 15 is formed by the lower substrate 11, the upper substrate 12, and the support frame 14 of the piezoelectric vibrator 13. A vacuum state is preferably maintained in the vibration space.

The lower substrate 11 and the upper substrate 12 are preferably formed from Si (silicon). In the piezoelectric vibrator 13, the support frame 14, the vibration portion 15, and the connection portions 16 are formed from a silicon oxide layer, that is, a $SiO_2$ (silicon dioxide) layer 21, a Si layer 22 laminated on the $SiO_2$ layer 21, and an AlN (aluminum nitride) layer 23 laminated on the Si layer 22. For the silicon oxide layer, a silicon oxide material having an appropriate composition of a $Si_aO_b$ layer (a and b are integers) may be used instead of the $SiO_2$ layer 21.

The Si layer 22 is formed from an n-type Si semiconductor which is a degenerated semiconductor and contains a Group 15 element such as P (phosphorus), As (arsenic), or Sb (antimony) as an n-type dopant. In the present embodiment, P (phosphorus) is used as the n-type dopant. In addition, the resistivity of the Si layer 22 is set within the range of not less than 0.5 mΩcm and not greater than 0.9 mΩcm by controlling the doping amount of the n-type dopant. The resistivity of the Si layer 22 will be described in detail later.

In the piezoelectric vibrator 13, the vibration portion 15 further includes first and second Mo (molybdenum) layers 24 and 25 which are formed on the lower surface and the upper surface of the AlN layer 23 such that the AlN layer 23 is interposed therebetween. The first and second Mo layers 24 and 25 form a lower electrode and an upper electrode, respectively, and are connected to an AC power supply (not shown) which is provided outside the piezoelectric vibration device 10. For this connection, for example, an electrode (not shown) formed on the upper surface of the upper substrate 12, a through silicon via (TSV) (not shown) formed within the upper substrate 12, and the like are used.

The AlN layer 23 is a piezoelectric thin film which converts an applied voltage to vibration. For the piezoelectric thin film, for example, ZnO (zinc oxide), ScAlN (scandium aluminum nitride), PZT (lead zirconate titanate), KNN ((K,Na)NbO3: potassium sodium niobate), or the like may be used instead of the AlN layer 23. With ScAlN, when the atomic percentage of Sc and Al is defined as 100 at %, the Sc percentage is preferably set to be not less than about 0.5 at % and not greater than about 50 at %.

For the lower electrode and the upper electrode, a metallic material such as Ru (ruthenium), Pt (platinum), Ti (titanium), Cr (chromium), Al (aluminum), Cu (copper), Ag (silver), or an alloy thereof may be used instead of the first and second Mo layers 24 and 25.

In the piezoelectric vibration device 10 of the present embodiment, the AlN layer 23 is C-axis oriented substantially perpendicularly to the Si layer 22. When an alternating electric field is applied substantially in a C-axis direction between the first Mo layer 24 and the second Mo layer 25, the vibration portion 15 is excited. As a result, the vibration portion 15 vibrates so as to expand and contract in a short-side direction, that is, in the Y-axis direction. In other words, in the Y-axis direction, expansion/contraction vibration occurs in which a state where the vibration portion 15 expands and a state where the vibration portion 15 contracts are repeated.

Next, the advantageous effect achieved by the resistivity of the Si layer 22 being within the range of not less than 0.5 mΩcm and not greater than 0.9 mΩcm, will be described. The present inventors verified change of the primary temperature coefficient of resonant frequency (TCF) of the piezoelectric vibration device 10 with respect to change of the resistivity of the Si layer 22 caused with change of the doping amount. For the verification, a simulation was executed by a finite element method (FEM) on the basis of the above-described piezoelectric vibration device 10. For the simulation, a piezoelectric vibration device 10 having a length of 100 μm in the Y-axis direction and a length of 145 μm in an X-axis direction along the XY plane was assumed.

In the vibration portion 15, the thickness of the $SiO_2$ layer 21 was set to 0.52 μm, the thickness of the AlN layer 23 was set to 0.8 μm, and the thickness of each of the first Mo layer 24 and the second Mo layer 25 was set to 0.1 μm. Furthermore, the thickness of the Si layer 22 was set to each of 5 μm, 10 μm, and 20 μm, and frequency-temperature characteristics when the resistivity of the Si layer 22 was changed, were calculated on the basis of the simulation by the FEM. In addition, at the same time, the thickness of the Si layer 22 was set to 10 μm, and frequency-temperature characteristics when the resistivity of the Si layer 22 was changed, were actually measured. The resistivity of the Si layer 22 was actually measured, for example, by a four point probe method in a state before the AlN film 23 and the like were formed on the Si layer 22.

Figure 4:
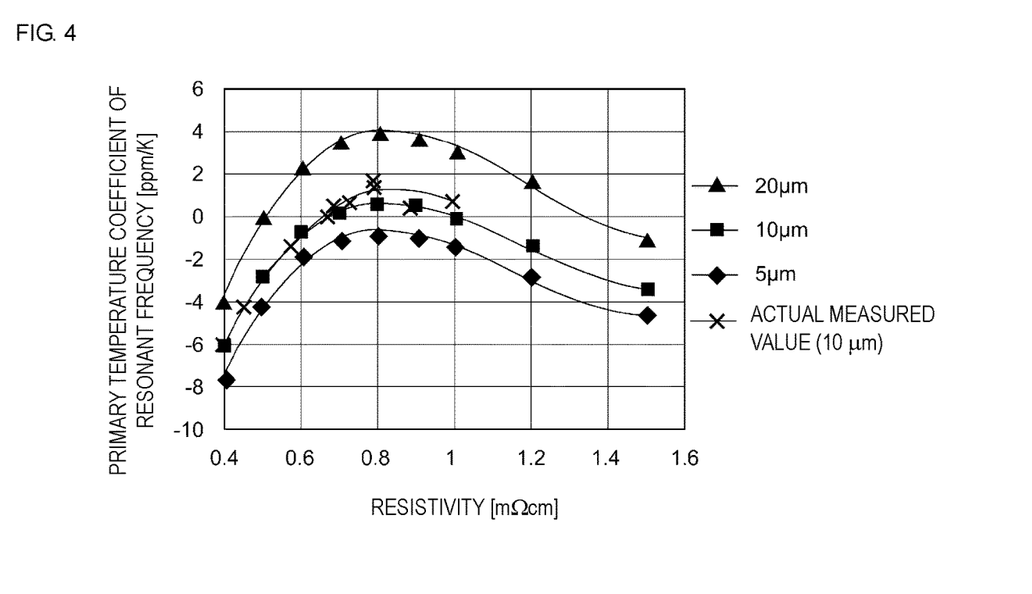
FIG. 4 is a graph showing a relationship between the resistivity of a Si layer and a primary temperature coefficient of resonant frequency.

FIG. 4 is a graph showing a relationship between the resistivity [mΩcm] of the Si layer 22 and the primary temperature coefficient of resonant frequency [ppm/K]. As shown in FIG. 4, it was confirmed that the results of the simulation by the FEM indicate the same tendency as that of the actually measured values. As a result of the simulation, when the resistivity is the same, the primary temperature coefficient of resonant frequency increases as the thickness of the Si layer 22 increases. Meanwhile, even when the thickness of the Si layer 22 is changed, it is confirmed that the tendency in change of the primary temperature coefficient of resonant frequency with respect to the change of the resistivity almost does not change. Furthermore, when the resistivity of the Si layer 22 is, for example, in the range of not less than 0.5 mΩcm and not greater than 1.2 mΩcm, it is confirmed that the fluctuations of the primary temperature coefficient of resonant frequency are small regardless of the thickness of the Si layer 22.

Next, the present inventors verified change of the primary temperature coefficient of resonant frequency of the piezoelectric vibration device 10 with respect to change of the resistivity of the Si layer 22 when the thickness of the $SiO_2$ layer 21 was changed. For the verification, similarly to the above description, a simulation was executed by a FEM on the basis of the piezoelectric vibration device 10. The change of the resistivity of the Si layer 22 when the thickness of the SiO2 layer 21 was set to each of 0 µm (i.e., in the case where the SiO2 layer 21 was not formed), 0.52 µm, and 1.0 µm was calculated on the basis of the simulation by the FEM. In any of the cases, the thickness of the Si layer 22 was set to 10 µm.

Figure 5:
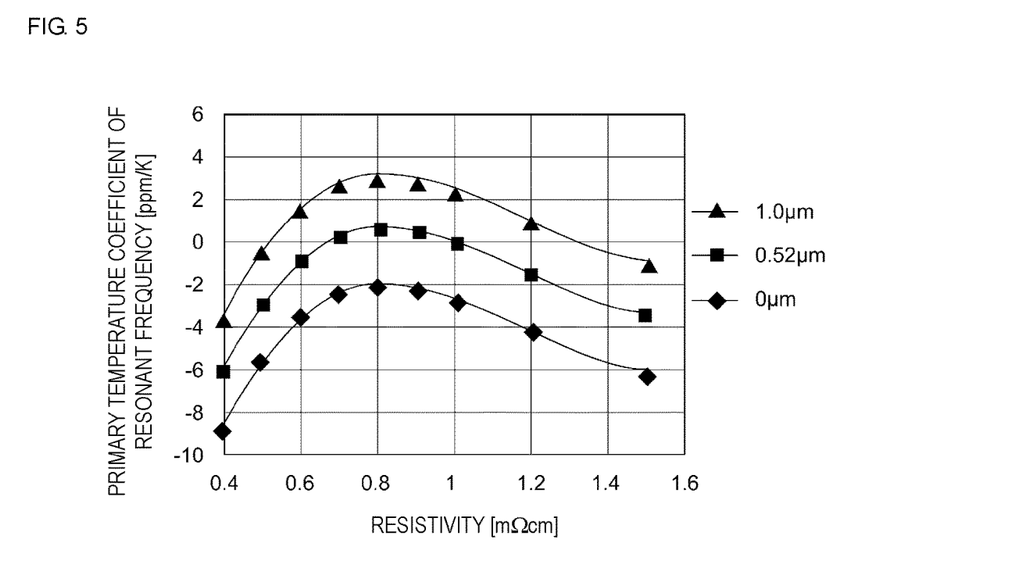
FIG. 5 is a graph showing a relationship between the resistivity of the Si layer and the primary temperature coefficient of resonant frequency.

FIG. 5 is a graph showing a relationship between the resistivity [mΩcm] of the Si layer 22 and the primary temperature coefficient of resonant frequency [ppm/K]. As shown in FIG. 5, when the resistivity is the same, the primary temperature coefficient of resonant frequency increases as the thickness of the SiO2 layer 21 increases. Meanwhile, even when the thickness of the SiO2 layer 21 is changed, it is confirmed that the tendency in change of the primary temperature coefficient of resonant frequency with respect to the change of the resistivity almost does not change. Furthermore, when the resistivity of the Si layer 22 is, for example, in the range of not less than 0.5 mΩcm and not greater than 1.2 mΩcm, it is confirmed that the fluctuations of the primary temperature coefficient of resonant frequency are small regardless of the thickness of the SiO2 layer 21.

According to the result of the simulation shown in FIG. 5, it is confirmed that regardless of the thickness of the SiO2 layer 21, the fluctuations of the primary temperature coefficient of resonant frequency are small when the resistivity of the Si layer 22 is, for example, in the range of not less than 0.5 mΩcm and not greater than 1.2 mΩcm. Furthermore, it is confirmed that as compared to the case where the SiO2 layer 21 is not present (i.e., the case where the thickness is 0 µm), the primary temperature coefficient of resonant frequency increases as the thickness of the SiO2 layer 21 increases. Therefore, as a result of the simulation, it is confirmed that even if variations occur in the value of the doping amount of the dopant, it is possible to correct the primary temperature coefficient of resonant frequency by controlling the thickness of the SiO2 layer 21.

Figure 6:
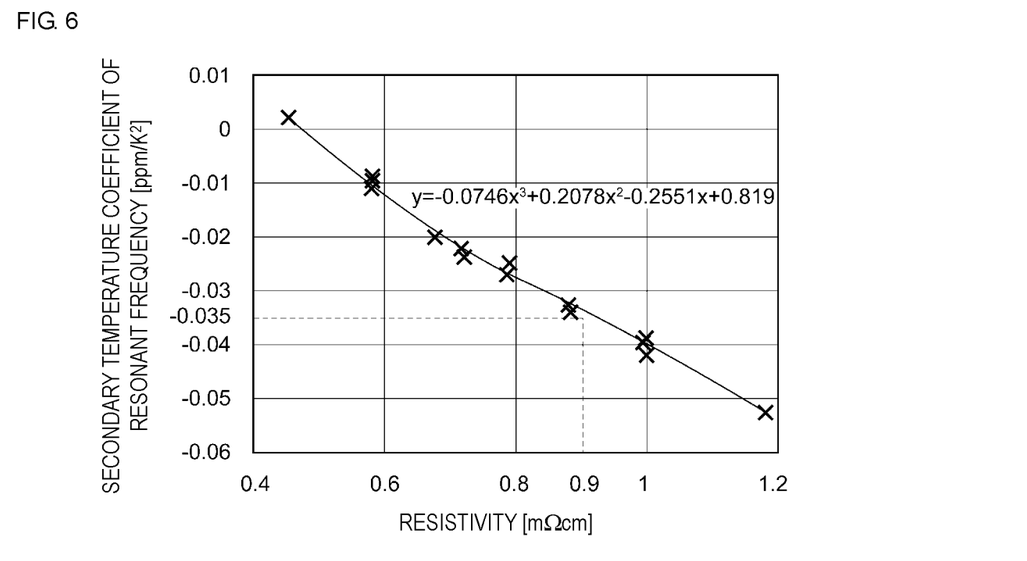
FIG. 6 is a graph showing a relationship between the resistivity of the Si layer and a secondary temperature coefficient of resonant frequency.

Next, the present inventors verified change of the secondary temperature coefficient of resonant frequency of the piezoelectric vibration device 10 with respect to change of the resistivity of the Si layer 22. For the verification, the secondary temperature coefficient of resonant frequency when the resistivity was changed by changing the doping amount of the n-type dopant with respect to the Si layer 22 in the aforementioned piezoelectric vibration device 10, was calculated on the basis of actual measurement. The thickness of the Si layer 22 was set to 10 µm. FIG. 6 is a graph showing a relationship between the resistivity [mΩcm] of the Si layer 22 and the secondary temperature coefficient of resonant frequency [ppm/K2]. As is obvious from FIG. 6, it is confirmed that the secondary temperature coefficient of resonant frequency increases as the resistivity of the Si layer 22 decreases with increase of the doping amount of the n-type dopant with respect to the Si layer 22.

Figure 7:
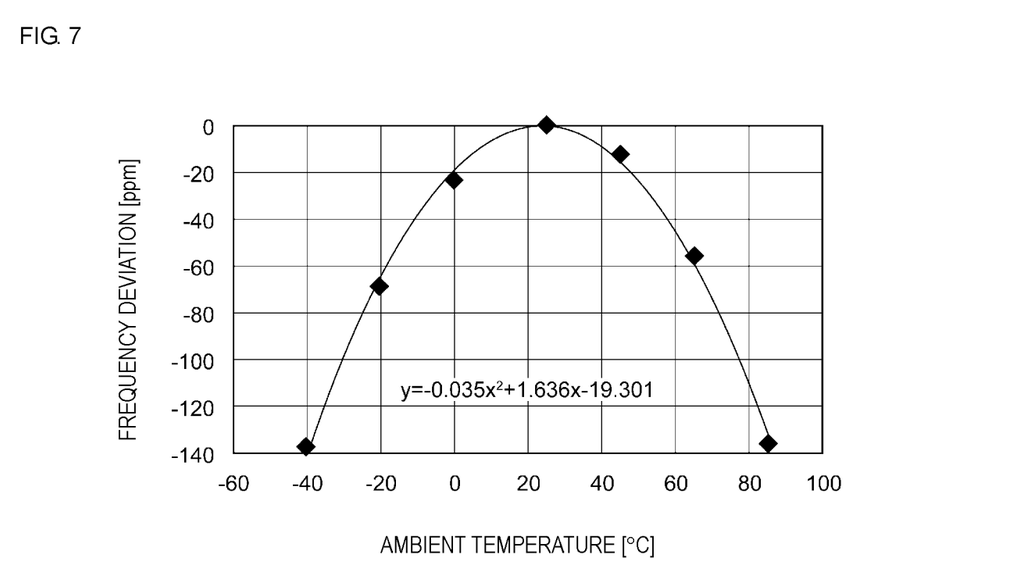
FIG. 7 is a graph showing temperature characteristics of a crystal vibrator.

FIG. 7 is a graph showing the temperature characteristics of a general tuning fork type crystal vibrator. As is obvious from FIG. 7, the secondary temperature coefficient of resonant frequency of the tuning fork type crystal vibrator is about −0.035. Also for the piezoelectric vibrator 13 of the present invention, temperature characteristics equal to or greater than those of the tuning fork type crystal vibrator are required. That is, it is necessary to control the doping amount such that the temperature coefficient of resonant frequency is set to −0.035 or greater in FIG. 6. When this temperature coefficient of resonant frequency is applied to the piezoelectric vibration device 10 of the present invention, it is confirmed that the resistivity of the Si layer 22 is desirably set to about 0.9 mΩcm or less as is apparent from FIG. 6.

According to the results of the simulations and the actual measurements described above, the resistivity of the Si layer 22 is desirably not less than 0.5 mΩcm and not greater than 1.2 mΩcm from the relationship between the resistivity of the Si layer 22 and the primary frequency-temperature characteristics, and the upper limit of the resistivity of the Si layer 22 is desirably 0.9 mΩcm from the relationship between the resistivity of the Si layer 22 and the secondary frequency-temperature characteristics. In consideration of these results, the resistivity of the Si layer 22 is particularly desirably set to be not less than 0.5 mΩcm and not greater than 0.9 mΩcm, by controlling the doping amount of the n-type dopant with respect to the Si layer 22 in the present invention. According to such a configuration, it is possible to favorably maintain the frequency-temperature characteristics of the piezoelectric vibration device 10.

In the piezoelectric vibration device 10 described above, it is possible to reduce the fluctuations of the primary temperature coefficient of resonant frequency by controlling the doping amount of the n-type dopant with respect to the Si layer 22 to set the resistivity of the Si layer 22 to be not less than 0.5 mΩcm and not greater than 0.9 mΩcm. Furthermore, it is also possible to reduce the secondary temperature coefficient of resonant frequency by setting the resistivity of the Si layer 22 to be not greater than 0.9 mΩcm. Therefore, according to the present invention, it is possible to provide the piezoelectric vibration device 10 having favorable frequency-temperature characteristics.

Figure 8:
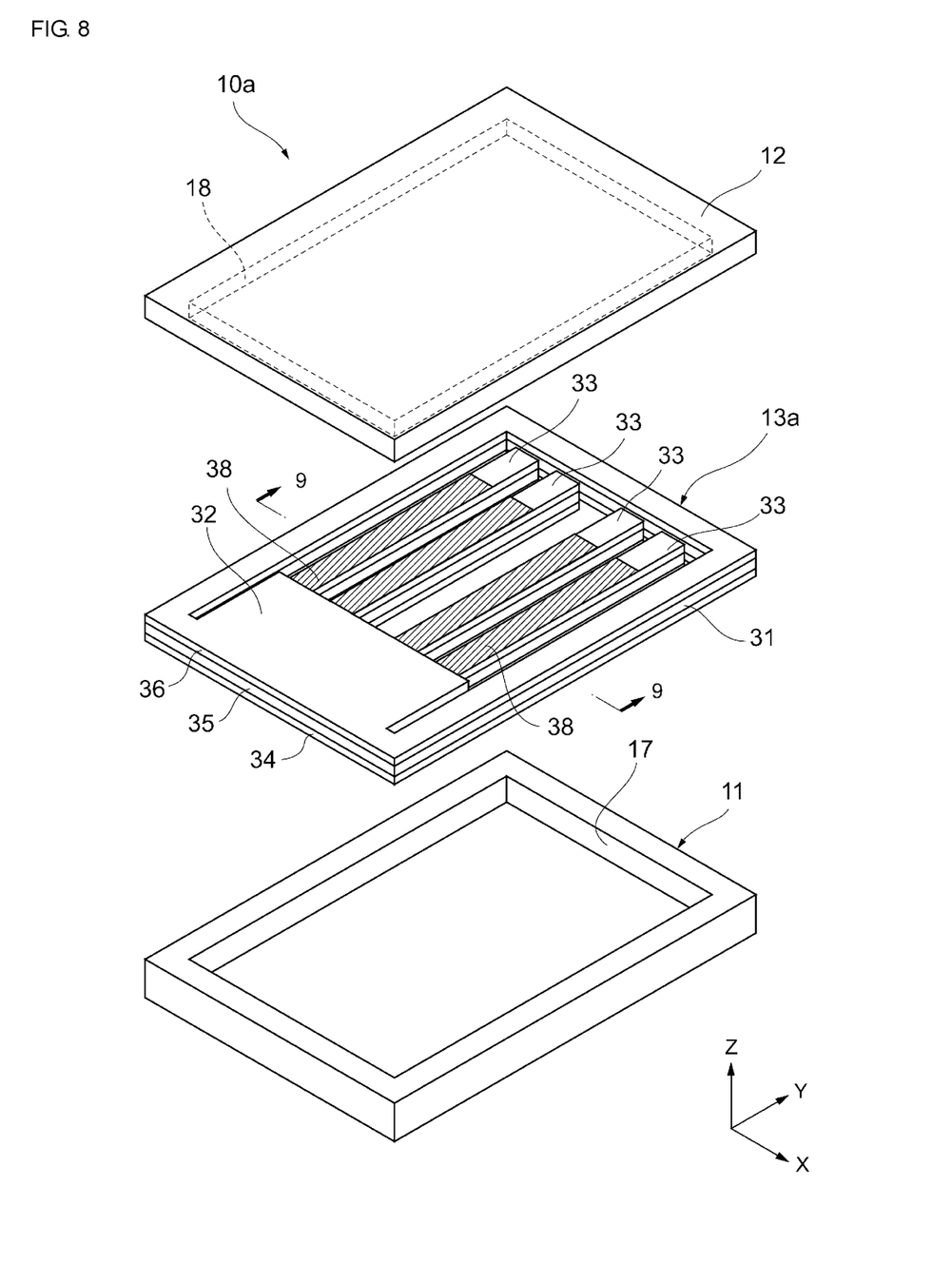
FIG. 8 is an exploded perspective view schematically showing the structure of a piezoelectric vibration device according to a second embodiment of the present invention.

FIG. 8 is an exploded perspective view schematically showing the structure of a piezoelectric vibration device 10a according to a second embodiment of the present invention. The piezoelectric vibration device 10a includes a piezoelectric vibrator 13a which vibrates in an out-of-plane vibration mode, instead of the above-described piezoelectric vibrator 13 which vibrates in an in-plane vibration mode. Similarly to the above-described piezoelectric vibrator 13, the piezoelectric vibrator 13a is interposed and held between the lower substrate 11 and the upper substrate 12. The remaining structure is the same as the structure of the above-described first embodiment and thus the overlap description is omitted.

The piezoelectric vibrator 13a includes: a support frame 31 which extends in a rectangular flame shape along an XY plane in an orthogonal coordinate system in FIG. 8; a base portion 32 which is disposed within the support frame 31, spreads along the XY plane, and extends from one end of the support frame 31 within the support frame 31; and a plurality of vibration portions, that is, vibration arms 33 which extends along the XY plane from fixed ends thereof connected to the distal end of the base portion 32 toward free ends thereof. The piezoelectric vibrator 13a of the present embodiment includes four vibration arms 33, but the number of the vibration arms is not limited to four, and is set to an arbitrary number, for example, three or more.

Figure 9:
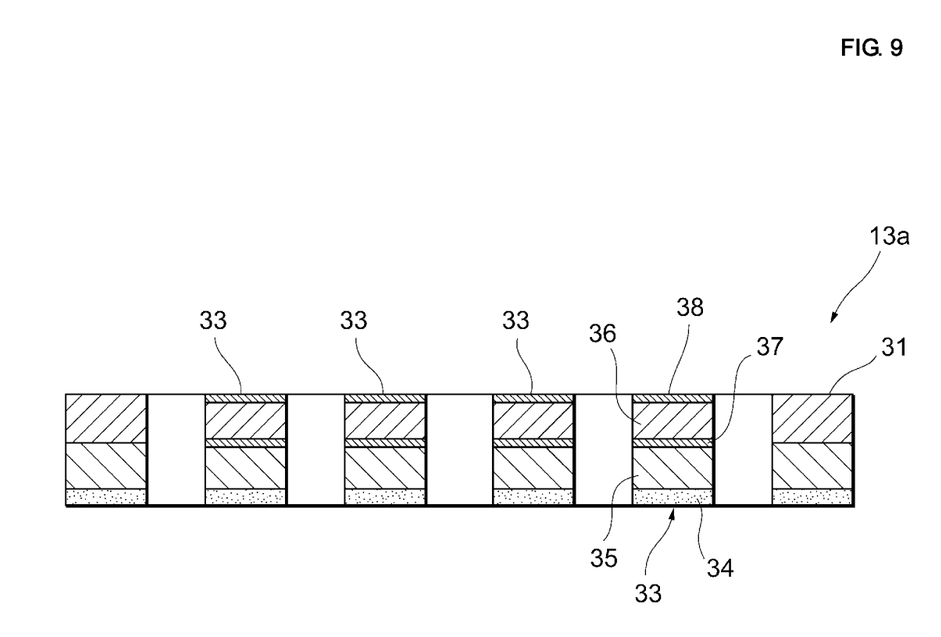
FIG. 9 is a schematic cross-sectional view taken along the line 9-9 in FIG. 8.

FIG. 9 is a schematic cross-sectional view of the piezoelectric vibrator 13a taken along the line 9-9 in FIG. 8. As is obvious from FIG. 9, similarly to the above-described vibration portion 15, each vibration arm 33 includes a SiO2 layer 34, a Si layer 35, an AlN layer 36, and first and second Mo layers 37 and 38. Similarly to the Si layer 22, the Si layer 35 is formed from an n-type Si semiconductor which is a degenerated semiconductor, and contains P (phosphorus) as an n-type dopant. The first and second Mo layers 37 and 38 form a lower electrode and an upper electrode. The AlN layer 36 is a piezoelectric film which converts an applied voltage to vibration.

In the piezoelectric vibrator 13a, the AlN layer 36 is C-axis oriented substantially perpendicularly to the Si layer 35. Therefore, when a voltage is applied to the AlN layer 36 between the first and second Mo layers 37 and 38 in the C-axis direction, the AlN layer 36 expands and contracts in a direction which is substantially perpendicularly to the C axis. Because of the expansion and contraction of the AlN layer 36, the vibration arm 33 is displaced in a bending manner in a Z-axis direction and vibrates in an out-of-plane bending vibration mode. Also in the piezoelectric vibrator 13a, similarly to the above, by setting the resistivity of the Si layer 35 to be not less than 0.5 mΩcm and not greater than 0.9 mΩcm, it is possible to provide the piezoelectric vibration device 10 having favorable frequency-temperature characteristics.

Figure 10:
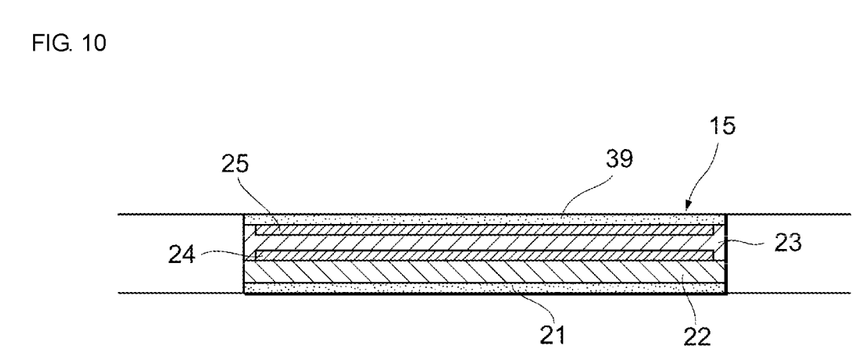
FIG. 10 is a schematic cross-sectional view of a vibration portion corresponding to FIG. 3.
Figure 11:
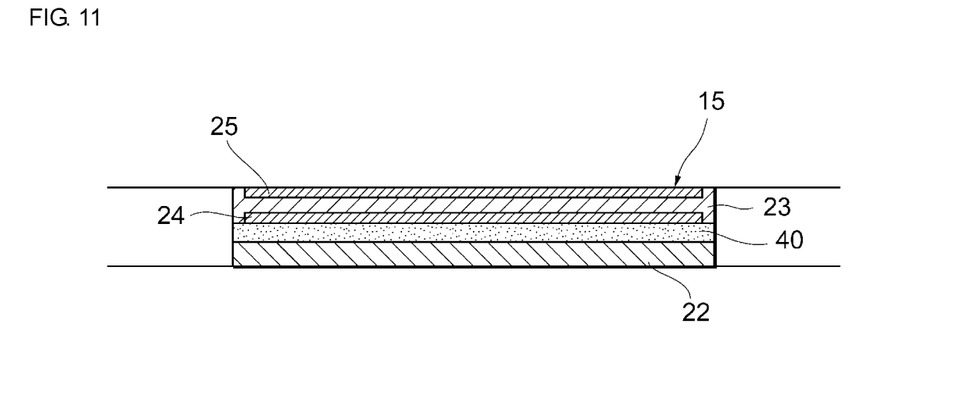
FIG. 11 is a schematic cross-sectional view of a vibration portion corresponding to FIG. 3.

In the piezoelectric vibration device 10 described above, the SiO2 layer 21 is formed on the lower surface of the Si layer 22. However, in addition to the SiO2 layer 21, as shown in FIG. 10, a SiO2 layer 39 may be formed on the upper surface of the vibration portion 15, that is, on the upper surface of the second Mo layer 25. In this case, the formation of the SiO2 layer 21 may be omitted. In addition, as shown in FIG. 11, a SiO2 layer 40 may be formed on the Si layer 22 and the lower surface of the vibration portion 15, that is, the lower surface of the first Mo layer 24. In this case, SiO2 layers 21 and 39 may be further formed. According to such SiO2 layers 21, 39, and 40, it is possible to further suppress the fluctuations of the frequency-temperature characteristics of the piezoelectric vibrator 13. The piezoelectric vibration device 10a may also be formed similarly.

It should be appreciated that each embodiment described is intended to facilitate understanding of the present invention, and but not to limit interpretation of the present invention in any way. The present invention may be modified/improved without departing from the spirit and scope of the invention, and equivalents thereof are also included in the present invention. That is, each embodiment for which the design is changed as appropriate by a person skilled in the art is also included in the scope of the present invention as long as the features of the present invention are included. For example, each element included in each embodiment, and the arrangement, material, conditions, shape, size, etc. thereof are not limited to illustrated ones, and may be changed as appropriate. Moreover, each element included in each embodiment is combined, and combinations thereof are included in the scope of the present invention as long as the features of the present invention are included.

REFERENCE SIGNS LIST 10 piezoelectric vibration device
10a piezoelectric vibration device
15 vibration portion
21 silicon oxide layer (SiO$_2$ layer)
22 Si layer
23 piezoelectric thin film (AlN layer)
33 vibration portion
35 Si layer
36 piezoelectric thin film (AlN layer)
39 silicon oxide layer (SiO$_2$ layer)
40 silicon oxide layer (SiO$_2$ layer)

The invention claimed is:

1. A piezoelectric vibrator comprising a vibration portion having an n-type Si layer and which has a resistivity of not less than 0.5 mΩcm and not greater than 0.9 mΩcm.

2. The piezoelectric vibrator according to claim 1, wherein the vibration portion has a piezoelectric thin film formed on the Si layer.

3. The piezoelectric vibrator according to claim 2, wherein the vibration portion further has a silicon oxide layer formed on at least one of an upper surface of the Si layer, a lower surface of the Si layer, and an upper surface of the piezoelectric thin film.

4. The piezoelectric vibrator according to claim 1, wherein the vibrator is planar and operates in an in plane vibration mode.

5. The piezoelectric vibrator according to claim 1, wherein the vibrator is planar and operates in an out of plane vibration mode.

6. A piezoelectric vibration device comprising:
a lower substrate;
an upper substrate cooperating with the lower substrate to form a vibration space between the lower substrate and the upper substrate; and
a piezoelectric vibrator disposed within the vibration space, the piezoelectric vibrator including a vibration portion having an n-type Si layer and which has a resistivity of not less than 0.5 mΩcm and not greater than 0.9 mΩcm.

7. The piezoelectric vibration device according to claim 6, wherein the vibration portion has a piezoelectric thin film formed on the Si layer.

8. The piezoelectric vibration device according to claim 7, wherein the vibration portion further has a silicon oxide layer formed on at least one of an upper surface of the Si layer, a lower surface of the Si layer, and an upper surface of the piezoelectric thin film.

9. The piezoelectric vibration device according to claim 6, wherein the vibrator is planar and operates in an in plane vibration mode.

10. The piezoelectric vibration device according to claim 6, wherein the vibrator is planar and operates in an out of plane vibration mode.

11. The piezoelectric vibrator according to claim 6, wherein the n-type Si layer is a degenerated semiconductor.

12. The piezoelectric vibrator according to claim 6, wherein the piezoelectric vibrator is a tuning fork type crystal vibrator.

13. The piezoelectric vibrator according to claim 1, wherein the n-type Si layer is a degenerated semiconductor.

14. The piezoelectric vibrator according to claim 1, wherein the piezoelectric vibrator is a tuning fork type crystal vibrator.

* * * * *